US010031196B2

(12) United States Patent
Rabinovitz et al.

(10) Patent No.: US 10,031,196 B2
(45) Date of Patent: Jul. 24, 2018

(54) TEMPERATURE-CONTROLLED EXCHANGEABLE NMR PROBE CASSETTE AND METHODS THEREOF (71) Applicant: ASPECT AI LTD., Netanya (IL)

(72) Inventors: Itzchak Rabinovitz, Ness Ziona (IL); Tal Cohen, Herzlia (IL)

(73) Assignee: Aspect AI Ltd., Netanya (IL)

(*) Notice: Subject to any disclaimer, the term of this patent is extended or adjusted under 35 U.S.C. 154(b) by 840 days.

(21) Appl. No.: 14/504,890

(22) Filed: Oct. 2, 2014

(65) Prior Publication Data
US 2016/0077176 A1 Mar. 17, 2016

Related U.S. Application Data (60) Provisional application No. 62/050,224, filed on Sep. 15, 2014.

(51) Int. Cl.
G01V 3/00 (2006.01)
G01R 33/38 (2006.01)
G01R 33/28 (2006.01)
G01R 33/48 (2006.01)

(52) U.S. Cl.
CPC .......... G01R 33/3804 (2013.01); G01R 33/28 (2013.01); G01R 33/48 (2013.01)

(58) Field of Classification Search
CPC .... G01R 33/307; G01R 33/30; G01R 33/302; G01R 33/305; G01N 24/08
USPC ........................................ 324/321
See application file for complete search history.

(56) References Cited

U.S. PATENT DOCUMENTS

| 5,166,620 A | 11/1992 | Panosh |
| 5,371,464 A | 12/1994 | Rapoport |
| 5,534,780 A * | 7/1996 | Lilly ................... G01R 33/307 324/321 |

(Continued)

FOREIGN PATENT DOCUMENTS

| CN | 201464391 | 5/2010 |
| CN | 102288629 | 12/2011 |

(Continued)

OTHER PUBLICATIONS

Aspect Imaging Ltd., "Shutting Assembly for Closing an Entrance of an MRI Device", co-pending U.S. Appl. No. 14/540,163, filed Nov. 13, 2014.

(Continued)

Primary Examiner — Walter L Lindsay, Jr.
Assistant Examiner — Frederick Wenderoth
(74) Attorney, Agent, or Firm — Pearl Cohen Zedek Latzer Baratz LLP (57) ABSTRACT A nuclear magnetic resonance (NMR) probe cassette, with a removable conduit body made of a non-magnetic material having a longitudinal axis with an opening at one end, centered on the axis. The conduit body is reversibly connected to a heat exchanger to substantially maintain the conduit body at a predetermined temperature. The NMR probe cassette also includes a second conduit made of a non-magnetic material. The second conduit extends through the central opening in the first conduit body and is configured to receive and contain a sample. Still further, the NMR probe cassette includes a processor and computer readable media with instructions for controlling the heat exchanger.

4 Claims, 9 Drawing Sheets

(56) References Cited

U.S. PATENT DOCUMENTS

| | | | |
|---|---|---|---|
| 7,883,289 B2 | 2/2011 | Weisman | |
| 8,851,018 B2 | 10/2014 | Rapoport et al. | |
| 8,896,310 B2 | 11/2014 | Rapoport | |
| 2003/0206020 A1* | 11/2003 | Cohen | G01R 33/31 324/322 |
| 2005/0060868 A1* | 3/2005 | McMurtry | A61C 9/0093 29/559 |
| 2011/0162652 A1 | 3/2011 | Rapoport | |
| 2011/0186049 A1 | 3/2011 | Rapoport | |
| 2011/0234347 A1 | 9/2011 | Rapoport | |
| 2011/0304333 A1 | 12/2011 | Rapoport | |
| 2012/0071745 A1 | 3/2012 | Rapoport | |
| 2012/0073511 A1 | 3/2012 | Rapoport et al. | |
| 2012/0077707 A1 | 3/2012 | Rapoport | |
| 2012/0119742 A1 | 5/2012 | Rapoport | |
| 2013/0079624 A1 | 3/2013 | Rapoport | |
| 2013/0109956 A1 | 5/2013 | Rapoport | |
| 2013/0237803 A1 | 5/2013 | Rapoport | |
| 2013/0328559 A1 | 12/2013 | Rapoport | |
| 2013/0328560 A1 | 12/2013 | Rapoport | |
| 2013/0328563 A1 | 12/2013 | Rapoport | |
| 2014/0050827 A1 | 2/2014 | Rapoport | |
| 2014/0051973 A1 | 2/2014 | Rapoport et al. | |
| 2014/0051974 A1 | 2/2014 | Rapoport et al. | |
| 2014/0051976 A1 | 2/2014 | Rapoport et al. | |
| 2014/0099010 A1 | 4/2014 | Rapoport | |
| 2014/0103927 A1 | 4/2014 | Rapoport | |
| 2014/0117989 A1 | 5/2014 | Rapoport | |
| 2014/0128725 A1 | 5/2014 | Rapoport | |
| 2014/0139216 A1 | 5/2014 | Rapoport | |
| 2014/0142914 A1 | 5/2014 | Rapoport | |
| 2014/0152302 A1 | 6/2014 | Rapoport et al. | |
| 2014/0152310 A1 | 6/2014 | Rapoport | |
| 2014/0158062 A1 | 6/2014 | Rapoport et al. | |
| 2014/0230850 A1 | 8/2014 | Rapoport | |
| 2014/0257081 A1 | 9/2014 | Rapoport | |
| 2014/0266203 A1 | 9/2014 | Rapoport | |
| 2014/0300358 A1 | 10/2014 | Rapoport | |
| 2014/0378821 A1 | 12/2014 | Rapoport et al. | |
| 2014/0378825 A1 | 12/2014 | Rapoport et al. | |
| 2015/0065788 A1 | 3/2015 | Rapoport | |

FOREIGN PATENT DOCUMENTS

| | | |
|---|---|---|
| CN | 202267662 | 6/2012 |
| CN | 102954978 | 3/2013 |
| EP | 1102020 | 5/2001 |
| JP | 2009011652 | 1/2009 |

OTHER PUBLICATIONS

Aspect Imaging Ltd, "MRI-Incubator's Closure Assembly", co-pending U.S. Appl. No. 14/539,442, filed Nov. 12, 2014.

Aspect Imaging Ltd., "Cage in an MRD with a Fastening/Attenuating System", co-pending U.S. Appl. No. 14/527,950, filed Oct. 30, 2014.

Rapoport, Uri, "RF Shielding Conduit in an MRI Closure Assembly", co-pending U.S. Appl. No. 14/574,785, filed Dec. 18, 2014.

Aspect Imaging Ltd., "System and Method for Generating Invasively Hyperpolarized Images", co-pending U.S. Appl. No. 14/556,682, filed Dec. 1, 2014.

Aspect Imaging Ltd., "System and Method for Generating Invasively Hyperpolarized Images", co-pending U.S. Appl. No. 14/556,654, filed Dec. 1, 2014.

Aspect Imaging Ltd., "MRI with Magnet Assembly Adapted for Convenient Scanning of Laboratory Animals with Automated RF Tuning Unit", co-pending U.S. Appl. No. 14/581,266, filed Dec. 23, 2014.

Aspect Imaging Ltd., "Chamber for Housing Animals During Anaesthetic Procedures", co-pending U.S. Appl. No. 14/537,266, filed Nov. 10, 2014.

Aspect Imaging Ltd., "RF Automated Tuning System Used in a Magnetic Resonance Device and Methods Thereof", co-pending U.S. Appl. No. 14/588,741, filed Jan. 2, 2015.

Aspect Imaging Ltd., "Means for Operating an MRI Device Within a RF-Magnetic Environment", co-pending U.S. Appl. No. 14/596,320, filed Jan. 14, 2015.

Aspect Imaging Ltd., "Means and Method for Operating an MRI Device Within a RF-Magnetic Environment", co-pending U.S. Appl. No. 14/596,329, filed Jan. 14, 2015.

Aspect Imaging Ltd., "CT/MRI Integrated System for the Diagnosis of Acute Strokes and Methods Thereof", co-pending U.S. Appl. No. 14/598,517, filed Jan. 16, 2015.

Aspect Imaging Ltd., "Mechanical Clutch for MRI", co-pending U.S. Appl. No. 14/611,379, filed Feb. 2, 2015.

Aspect Imaging Ltd., "Method for Providing High Resolution, High Contrast Fused MRI Images", co-pending U.S. Appl. No. 13/877,533, filed May 22, 2014.

Aspect Imaging Ltd., "Method for Manipulating the MRI's Protocol of Pulse-Sequences", co-pending U.S. Appl. No. 14/070,695, filed Nov. 4, 2013.

Aspect Imaging Ltd., "Foamed Patient Transport Incubator", co-pending U.S. Appl. No. 14/531,289, filed Nov. 3, 2014.

Aspect Imaging Ltd., "Incubator Deployable Multi-Functional Panel", co-pending U.S. Appl. No. 14/619,557, filed Feb. 11, 2015.

Aspect Imaging Ltd., "MRI Thermo-Isolating Jacket", co-pending U.S. Appl. No. 14/623,039, filed Feb. 16, 2015.

Aspect Imaging Ltd., "MRI RF Shielding Jacket", co-pending U.S. Appl. No. 14/623,051, filed Feb. 16, 2015.

Aspect Imaging Ltd., "Capsule for a Pneumatic Sample Feedway", co-pending U.S. Appl. No. 14/626,391, filed Feb. 19, 2015.

Aspect Imaging Ltd., "Incubator's Canopy with Sensor Dependent Variably Transparent Walls and Methods for Dimming Lights Thereof", co-pending U.S. Appl. No. 14/453,909, filed Aug. 7, 2014.

Aspect Imaging Ltd., "Temperature-Controlled Exchangeable NMR Probe Cassette and Methods Thereof", co-pending U.S. Appl. No. 14/504,890, filed Oct. 2, 2014.

Aspect Imaging Ltd., "NMR Extractable Probe Cassette Means and Methods Thereof", co-pending U.S. Appl. No. 14/504,907, filed Oct. 2, 2014.

* cited by examiner

TEMPERATURE-CONTROLLED EXCHANGEABLE NMR PROBE CASSETTE AND METHODS THEREOF

This application claims priority to U.S. Provisional Patent Application No. 62/050,224, filed Sep. 15, 2014, which is incorporated herein by reference.

FIELD OF THE INVENTION

The present invention generally relates to nuclear magnetic resonance (NMR) testing apparatus and in particular to temperature-controlled exchangeable probe cassettes for NMR device, means and methods thereof.

BACKGROUND OF THE INVENTION

The disclosed systems and methods relate to nuclear magnetic resonance (NMR) testing and more particularly to NMR spectrometers probes.

Nuclear magnetic resonance (NMR) testing of substances to determine the constituents therein is well known in the art. In known devices, the sample can be arranged between the poles of a magnet and enclosed by a wire coil to enable a sample to be subjected to RF electromagnetic pulses of a predetermined frequency. The resulting NMR pulse generated by the nuclei of the sample under test can be detected and processed by the NMR device in a well-known manner to identify the sample constituents.

NMR analysis can be performed in devices commonly known as spectrometers. These spectrometers can have a probe that accepts the sample to be analyzed between poles of a magnet. The RF coils and tuning circuitry associated with the probe can create a magnetic field (B) that rotates the net magnetization of the nucleus. These RF coils also detect the transverse magnetization as it precesses in the X,Y plane. The RF coil can pulse the sample nucleus at the Lamor frequency to generate a readable signal for sample identification. An exemplary probe is disclosed in commonly owned U.S. Pat. No. 5,371,464 (Rapoport), and is incorporated herein by reference in its entirety. This probe and others like it, while an improvement in the art, still have several disadvantages.

A disadvantage of some probes includes the failure to react or respond to temperature changes of the sample, and particularly temperature increases caused by a sample where such temperature increases heat the magnet because of the strong thermal conductivity between the sample stream and the magnet. Samples are often presented to the probe at high temperatures to remain liquid for analysis, and to avoid gelling, solidifying or the like, if cooled. A sample can dissipate from within the probe and transfer to the ambient environment to ultimately reach the magnet and raise (or lower) the magnet's temperature. Heat from the sample may also be transferred by radiating through the ambient environment, and the sample temperature can be conducted through the probe material.

Since magnetic flux is proportional to magnet temperature, the magnet, upon heating (or other change of temperature) can undergo flux changes. These changes in flux can alter the homogeneity of the magnet, and thus the NMR results can be inaccurate, and in some cases, worthless.

Even a small change in sample stream temperature can be sufficient to cause a measurable change in magnetic flux. Frequency locks, such as that disclosed in U.S. Pat. No. 5,166,620 (Panosh), incorporated herein by reference in its entirety, can be introduced into probes to counter changes in flux, by controlling the frequency of the RF coils. As for changes in magnetic homogeneity, these can be made by shimming the magnet.

Currently, when magnet control is desired complex heat exchangers can be employed and placed in the path of the sample stream prior to its entry into the probe. This can be extremely costly and difficult to implement in in-line process environments.

Additionally, the temperature conductivity between the magnet and the sample stream can affect the sample itself. With the sample forced to remain in the probe for the desired testing time (period), the sample can change as its flow temporarily ceases during the analysis period. This temperature change can also affect the magnetic field and compromise NMR measurements.

Another aspect of the invention relates to another disadvantage of the common use of probes. In laboratory-related uses, changing samples, therefore changing probes, is often required. It is known that specimen probes may break during the changing process. Once this happens there is the need to disassemble the probe body from the machine in order to clean it and, in a worst case scenario, repair it in case that the spills caused any damage to the parts.

SUMMARY OF THE INVENTION

A NMR probe can include a temperature controlled conduit body for providing a sample for NMR measurement such that the temperature controlled conduit body can be substantially maintained at a desired temperature, regardless of the temperature of a sample included in the conduit body. By maintaining the temperature of the conduit body at the operating temperature of the NMR, for example, the magnetic field may not be affected by the temperature of the sample.

The probe and/or body can include a temperature sensor that can provide a processor with a temperature measurement of the conduit body. The processor can provide control instructions to a heat exchanger device to maintain the conduit body at the desired temperature. A heat exchanger can be understood herein to represent a device that can heat and cool as desired. The processor can include a display and/or controls to allow a user to set the desired temperature of the conduit body. In one embodiment, the temperature sensor and heat exchanger can be a single device, and for example, the temperature sensor and heat exchanger can include one or more commercially available heat pipes or heated air blowers. Alternately, the temperature sensor and heat exchanger can be separate devices, and the temperature sensor can include, for example, a piezoelectric temperature sensor, a thermocouple, or another commercially available analog or digital temperature sensor. Similarly, the heat exchanger can be a commercially available heat exchanging device that can provide controlled heating and cooling in any form, comprising air.

Additionally, in order to provide protection to the machine in case the NMR probe breaks, the body of the probe is configured as an extractable cassette, that can be replaced whenever is needed.

The present invention intends to presents a Nuclear Magnetic Resonance (NMR) probe cassette, comprising: a removable conduit body, having a longitudinal axis having an opening at one end of the conduit body, the opening centered on the axis, the conduit body is made of a non-magnetic material; a conduit extending through the central opening in the removable conduit body, the conduit for containing a sample and the conduit is of a non-magnetic material; and wherein the conduit body is reversible connected to a heat exchanger to substantially maintain the conduit body at a predetermined temperature.

The NMR probe cassette comprise a processor, and, instructions to cause the processor to control the heat exchanger.

The heat exchanger includes at least one of: at least one heat pipe, at least one heat transfer coil, at least one heated air blower and at least one heat fin.

The NMR probe cassette includes a temperature sensor which is in communications with the processor.

The heat exchanger provides temperature measurements of the conduit body.

The heat exchanger may or may not be connected to the conduit body.

The NMR probe cassette further includes a RF coil that journals at least a portion of the conduit, a frequency lock unit in communications with the RF coil.

The NMR probe cassette comprises at least one longitudinal guide along the conduit body's longitudinal axis for reversibly and reproducibly guide the probe cassette in and out of an NMR device.

The NMR probe cassette further comprises at least one pin for guiding position of the probe cassette in an NMR device.

The NMR probe cassette's conduit body is of a material selected from the group consisting of alumina, stainless steel, molybdenum, titanium and any combination thereof.

The NMR probe cassette's longitudinal guides are selected from the group consisting of tracks, rails, grooves and any combination thereof.

The NMR probe cassette's conduit body comprises two parallel longitudinal guides that are secured to either side of the conduit body.

The NMR probe cassette's conduit is cylindrical and adapted to support a sample tube characterized by a diameter of between about 5 mm to about 10 mm. The conduit is of a material selected from the group consisting of alumina, glass, stainless steel, titanium, molybdenum, sapphire, silicon and any combination thereof.

The NMR probe cassette comprises at least one locking means.

The NMR probe cassette's top portion of the conduit further comprises a tube holder made of a material selected from the group consisting of silicon, glass, alumina and any combination thereof.

The conduit is characterized by an open base portion for allowing flow of a sample.

The base portion is configured to allow the incorporation of an end portion; the end portion's top defines a floor for insertion of a sample tube.

The base portion is characterized by guides for allowing respective mating with the end portion. The guides define a scale of heights of the end portion.

The NMR probe cassette compres control electronics in operative communication with the RF coil and the frequency lock unit.

The NMR probe cassette further includes at least one tube holder located along the conduit body's longitudinal axis and having an opening configured to accommodate and support a sample tube.

The conduit body includes at least one frontal opening and at least one distal opening for the thermoregulating system. The frontal opening is configured to receive thermal regulated air. While the distal opening is configured to expel thermal regulated air.

A method for performing NMR on a sample, the method comprising steps of: obtaining an NMR probe cassette comprising of: a conduit body having a central opening along its longitudinal axis, the conduit body of a non-magnetic material; a conduit extending through the central opening in the conduit body, the conduit for containing a sample and the conduit is of a non-magnetic material; and an RF coil that spirals at least a portion of the central opening. Positioning the NMR probe cassette inside an NMR device; introducing the sample through a conduit, the conduit encased by a conduit body, and controlling the temperature of the conduit body; wherein the step of obtaining an NMR cassette further comprises a step of reversibly connecting the NMR cassette to a heat exchanger to substantially maintain the conduit body at a predetermined temperature.

DETAIL DESCRIPTION OF THE INVENTION

To provide an overall understanding, certain illustrative embodiments will now be described; however, it will be understood by one of ordinary skill in the art that the systems and methods described herein can be adapted and modified to provide systems and methods for other suitable applications and that other additions and modifications can be made without departing from the scope of the systems and methods described herein.

Unless otherwise specified, the illustrated embodiments can be understood as providing exemplary features of varying detail of certain embodiments, and therefore features, components, modules, and/or aspects of the illustrations can be otherwise combined, separated, interchanged, and/or rearranged without departing from the disclosed systems or methods. Additionally, the shapes and sizes of components are also exemplary, unless otherwise provided, and can be altered without affecting the disclosed systems or methods.

The disclosed temperature-controlled exchangeable NMR probe cassette includes a temperature controlled conduit body for providing a sample for NMR measurement. The temperature controlled conduit body can offset and/or counteract temperature effects of the sample on the magnetic field, such that the temperature of the conduit body remains substantially constant regardless of the sample temperature.

In one embodiment, the conduit body includes or encases a conduit for presenting the sample for NMR. The probe can include at least one temperature sensor that can provide a processor with a temperature measurement of the conduit body. In one embodiment, the temperature sensor(s) can be connected to or otherwise integrated with the conduit body. Additionally and optionally, the temperature sensor(s) may not be connected to the conduit body. The processor can be equipped with and provide control instructions to at least one heat exchanger to maintain the conduit body at a desired temperature. The heat exchanger may also be integrated with or separate from the conduit body. The processor can be in communications with a display and/or controls to allow a user to set the desired temperature of the conduit body. In one embodiment, the temperature sensor and heat exchanger can be a single device. In one such embodiment, for example, the temperature sensor(s) and heat exchanger(s) can include one or more commercially available heat pipes or heated air blowers. Alternately, the temperature sensor(s) and heat exchanger(s) can be separate devices, and the temperature sensor(s) can include, for example, a piezoelectric temperature sensor, a thermocouple, and/or another commercially available analog or digital temperature sensor(s). Similarly, the heat exchanger(s) can be commercially available heat exchanging device that can provide controlled heating and/or cooling.

The conduit body containing the probe can be extracted from the shimmer container, in order to be exchanged, repaired and modified.

The term "about" refers hereinafter to a range of 25% below or above the referred value.

Figure 1:
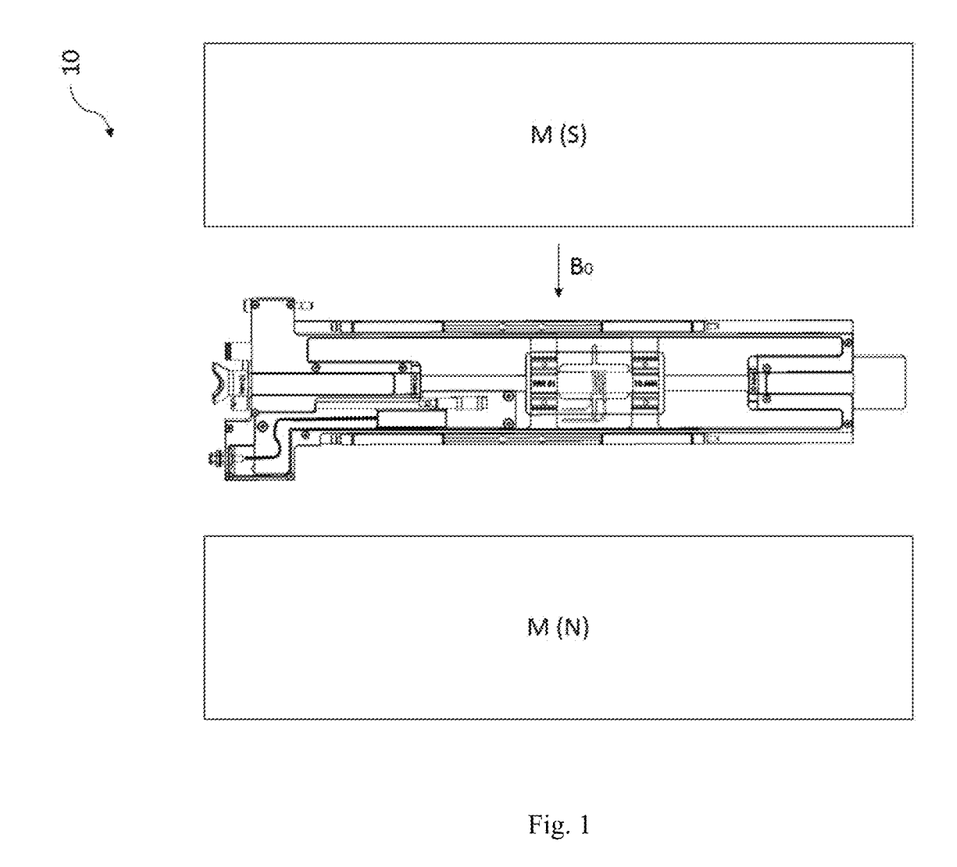
FIG. 1 is an upper view of one embodiment of a NMR probe cassette and its position related to the NMR magnets.

Reference is now made to FIG. 1 schematically presenting one embodiment of an NMR probe cassette 10 (without the shimming housing) according to the probe disclosed herein where the conduit body and temperature sensor/heat exchanger can be connected, although as provided herein, the disclosed apparatus is not limited to such an embodiment. The illustrated probe 10 is in use with a magnet M (typically having north "N" and south "S" poles), that generates a magnetic field (indicated by the vector Bo).

The probe cassette includes a conduit body which comprises a central opening along its longitudinal axis, for the insertion of a sample, in a tube or otherwise. The conduit body is made of a non-magnetic material, and could be made of, in a non-limiting example, alumina, stainless steel, molybdenum, titanium and any combination thereof. In one embodiment the NMR probe cassette can be operated using a continuous flow sample.

Figure 2:
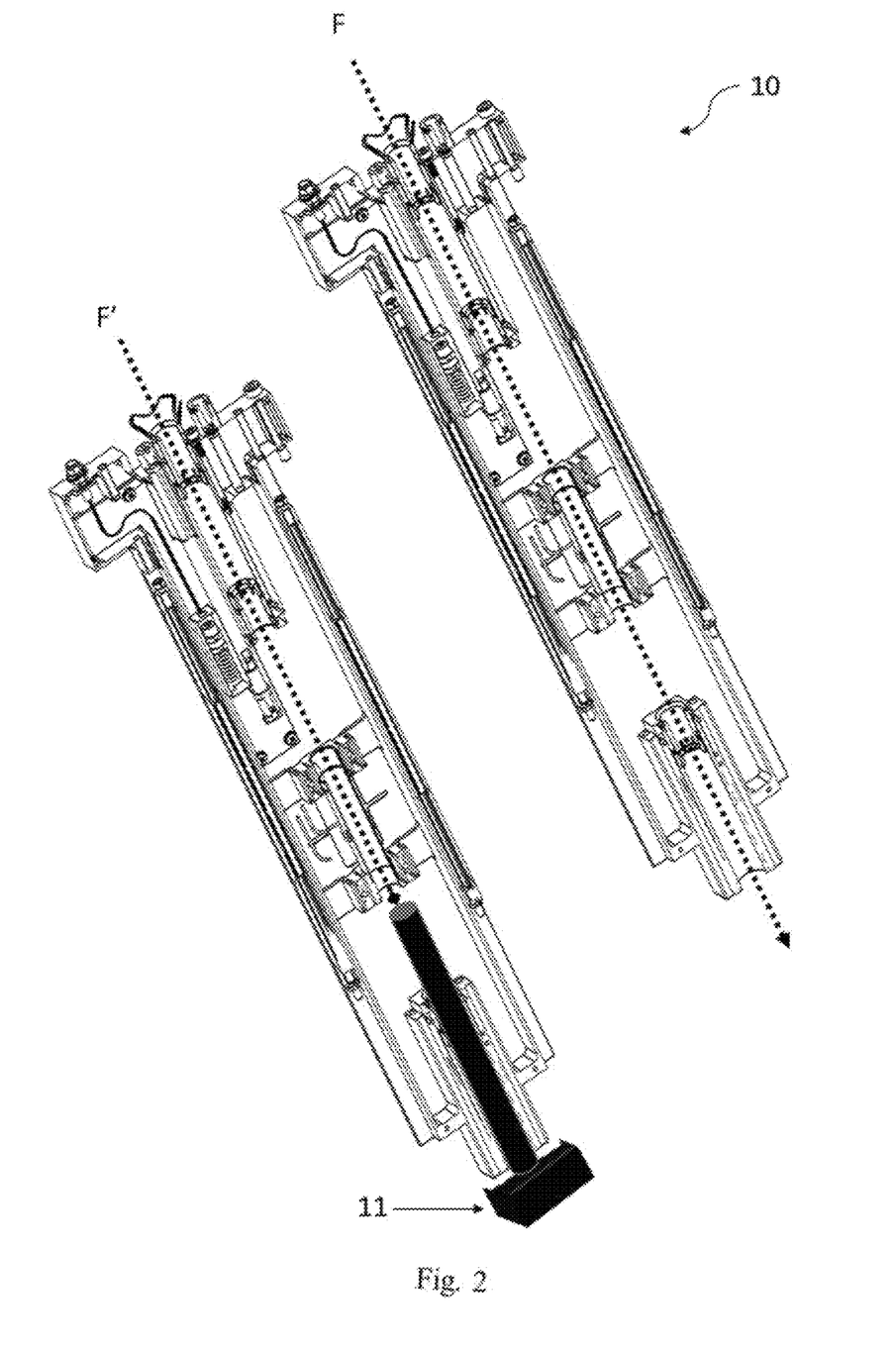
FIG. 2 provides a view of one embodiment of a NMR probe cassette and the direction of the flow of the sample and the depth of a sample tube.

Reference is now made to FIG. 2, schematically presenting the dotted black arrow F showing the direction of the flow. In another embodiment, the same cassette can be operated using a sample tube. In this case, the conduit's base portion may be in an embodiment configured to allow the incorporation of an end portion. The base portion section may comprise any guides, grooves, rails or the like to allow the sliding of such an end portion. The end portion is mountable to present a mechanical stopper and barrier for the incorporation of a sample tube. That is, the end portion makes up the floor by which the sample tube, inserted through the conduit, will be blocked and held in place. These guides may have a plurality of height adjusters which enable the adjustment of the height of the floor the end portion is creating. Thus, the guides may define a scale of heights which can be determined according to the sample tube used. This special stopper 11 is used in order to fix the sample tube to the desired depth in the cassette, ensuring the correct position of the sample for the reading. In this case the dotted line F' shows the depth in which the tube will stop.

Figure 3:
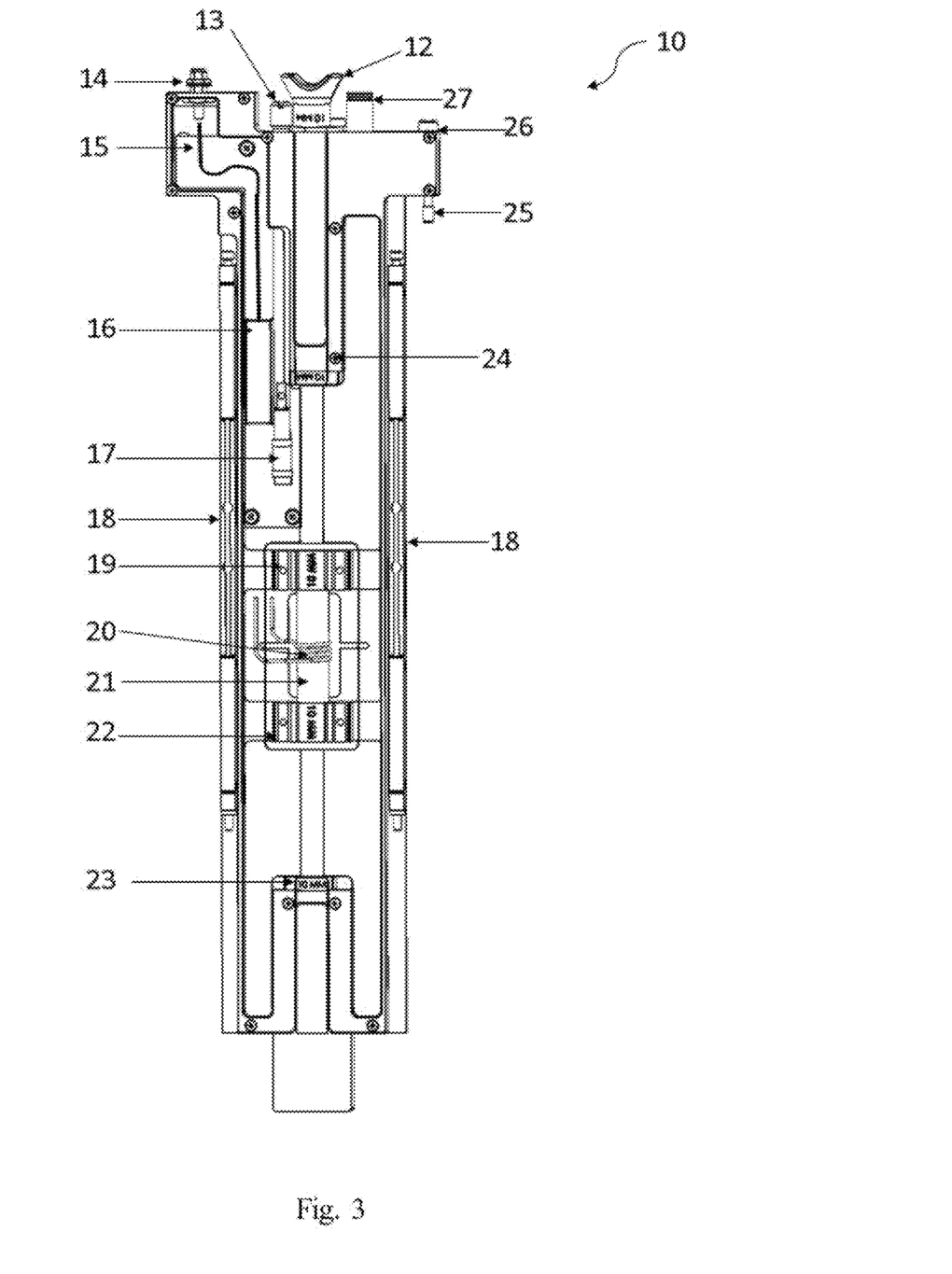
FIG. 3 is an upper view of one embodiment of a NMR probe and some of its parts.

Reference is now made to FIG. 3 schematically presenting an upper view of the NMR probe cassette and some specific parts. The numbers assigned to each part will be the kept in all the figures in order to avoid confusions.

Entry point of the sample 12; RF fine tuning knob 13; RF connection point 14; internal RF wire 15; RF lock compartment 16; RF fine tuning actuator 17; fine positioner system 18; frontal probe holder 19; RF coil 20; probe 21; distal probe holder 22; distal tube fixer 23; frontal tube fixer 24; locking screw 25; locking knob 26; temperature air system connection point 27.

A novel aspect of the present invention is the incorporation of at least one longitudinal fine positioner system 18, and preferably two such longitudinal guides 18, along the longitudinal axis of the probe cassette's conduit body. These longitudinal guides are for reversibly, reproducibly and accurately inserting and taking out the probe cassette in and out of an NMR device. The guides could be any mechanical guiding mechanism such as grooves, rails, tracks, etc. The guides could be, for example, in accordance with that detailed in U.S. Pat. No. 7,883,289, incorporated herein as a reference by its entirety. At least part of the central opening is encompassed by an RF coil 20, which spirals around the sample containing area.

An embodiment of the present invention may contain RF lock compartment 16 and this RF lock compartment may be connected to the RF connection point 14. The RF lock compartment may also be in operative communication with a RF fine tuning actuator 17, which is operated by RF fine tuning knob 13.

The conduit running across the central opening of the probe cassette, could be made of any non-magnetic material, and could be made in a non-limiting example of alumina, glass, stainless steel, titanium, molybdenum, sapphire, silicon and any combination thereof. The conduit and any of its segmental parts, could take the preferable shape of a cylinder, but could also assume any other shape (e.g. square, rectangle, polygonal, triangular, oval, etc.). The preferable diameter of the conduit is preferably configured to accommodate a sample tube characterized by a diameter of between about 5 mm and 10 mm, and could also be about 8 mm tube.

In an embodiment of the present invention, as further illustrated in FIG. 3, the conduit at its top end may contain an entry point of the sample 12 in its opening. The entry point of the sample 12 is preferably in the form of a cylinder or the like (although other shapes, e.g. square, rectangle, polygonal, triangular, oval, etc., are also permissible), and could be made from any non-magnetic material, such as in a non-limiting example, silicon, glass, alumina and any combination thereof. At least one other tube holder, preferably two or more tubes holders (19, 22, 23 and 24), along the central opening of the probe cassette presents another embodiment of the present invention. The tube holder may have any shape which could clasp any tube having any shape. A preferable embodiment is the incorporation of two such tube holders. The tube holders' function is to accurately locate and guide the sample tube inside the probe cassette.

The probe cassette in some embodiments may also comprise a heat circulation system entry point 12. The heat circulation system may be, for example, an aperture through which hot or cold air will be able to leave the probe cassette's conduit body and be replaced with air outside the conduit body, which is cooler/warmer. The air may leave in a passive way, or by any ventilation means, including sensor feedback in operable communication with ventilation motors.

The probe cassette may also comprise at least one locking means 25 and 26, intended to secure the probe cassette in place inside the NMR device.

Figure 4:
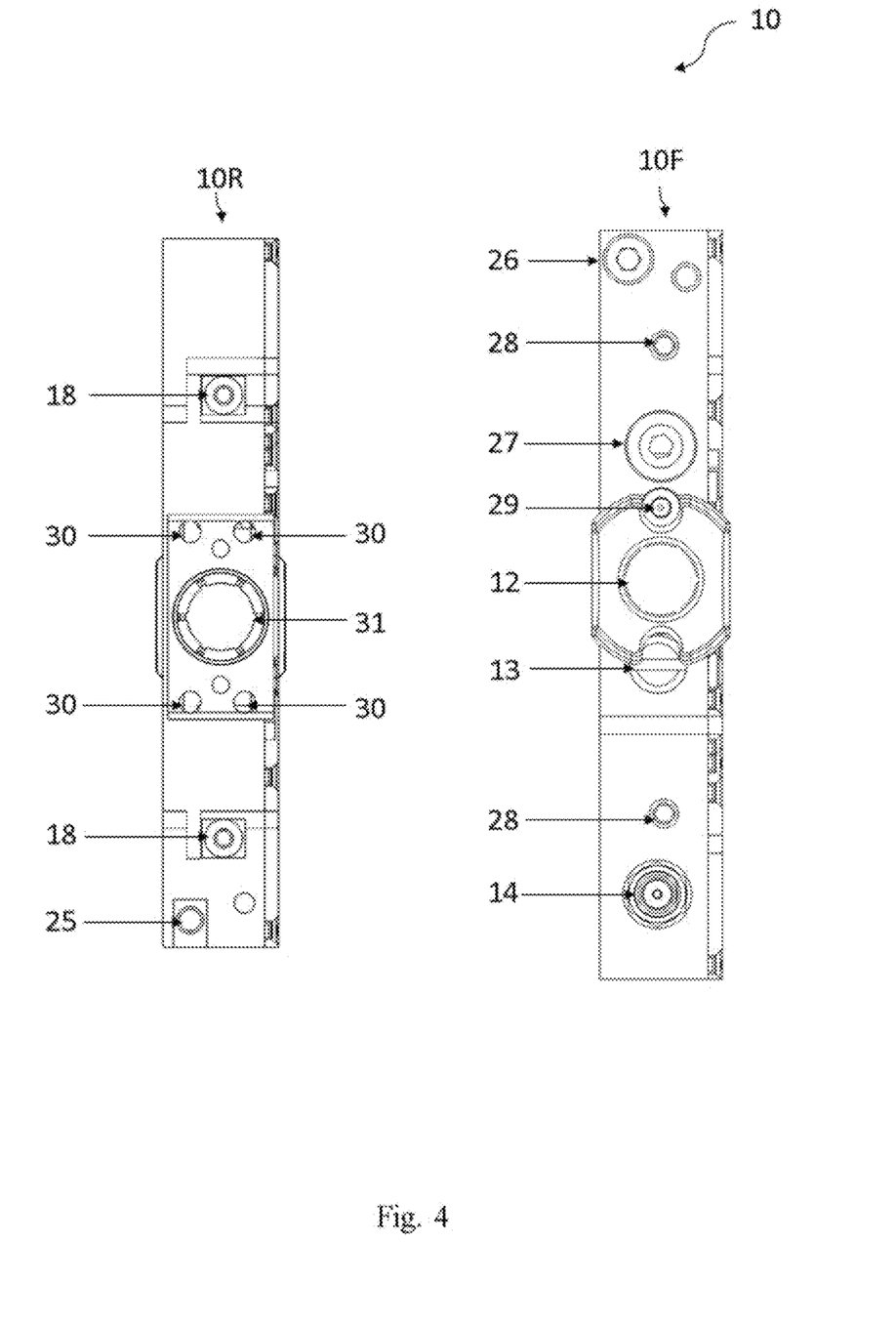
FIG. 4 provides a frontal and rear look of one embodiment of an NMR probe cassette and their parts.

Reference is now made to FIG. 4 schematically presenting a frontal and rear view of the NMR probe cassette and some specific parts.

Frontal view 10F: locking knob 26; fine positioner system knob 28; temperature air system connection point 27; cover screw 29; entry point of the sample 12; RF fine tuning knob 13; RF connection point 14.

Rear view 10R: fine positioner system 18; temperature air system exit apertures 30; rear exit of flow sample/entry point for tube stopper 31; locking screw 25.

In the frontal view 10F is shown the central opening containing the conduit 12, which is intended for inserting a flow-through sample, or a sample tube. In addition, the front of the probe cassette may also comprise RF connection point 14 and a RF fine tuning knob 13, as well as at least one aperture of a heat circulation system 27 and at least one locking means 26. Also illustrated are the fine positioner system knobs 28. The rear view 10R illustrates the central opening with conduit. An embodiment of the heat circulation system is shown by ventilation holes 30, which assist in circulating hot or cold air in and out of the probe cassette, following the temperature of the sample. The holes 30, may be in addition to other ventilation apertures, such as the ventilation aperture 27 found at the front of the probe cassette. The rear view also illustrates an embodiment of two rails 18, found in each side of the probe cassette's conduit body, and which are preferably according to the rails depicted in U.S. Pat. No. 7,883,289. The at least one locking means 25 can be seen looking through the bottom view, but is actually found on the top of the probe cassette.

Figure 5:
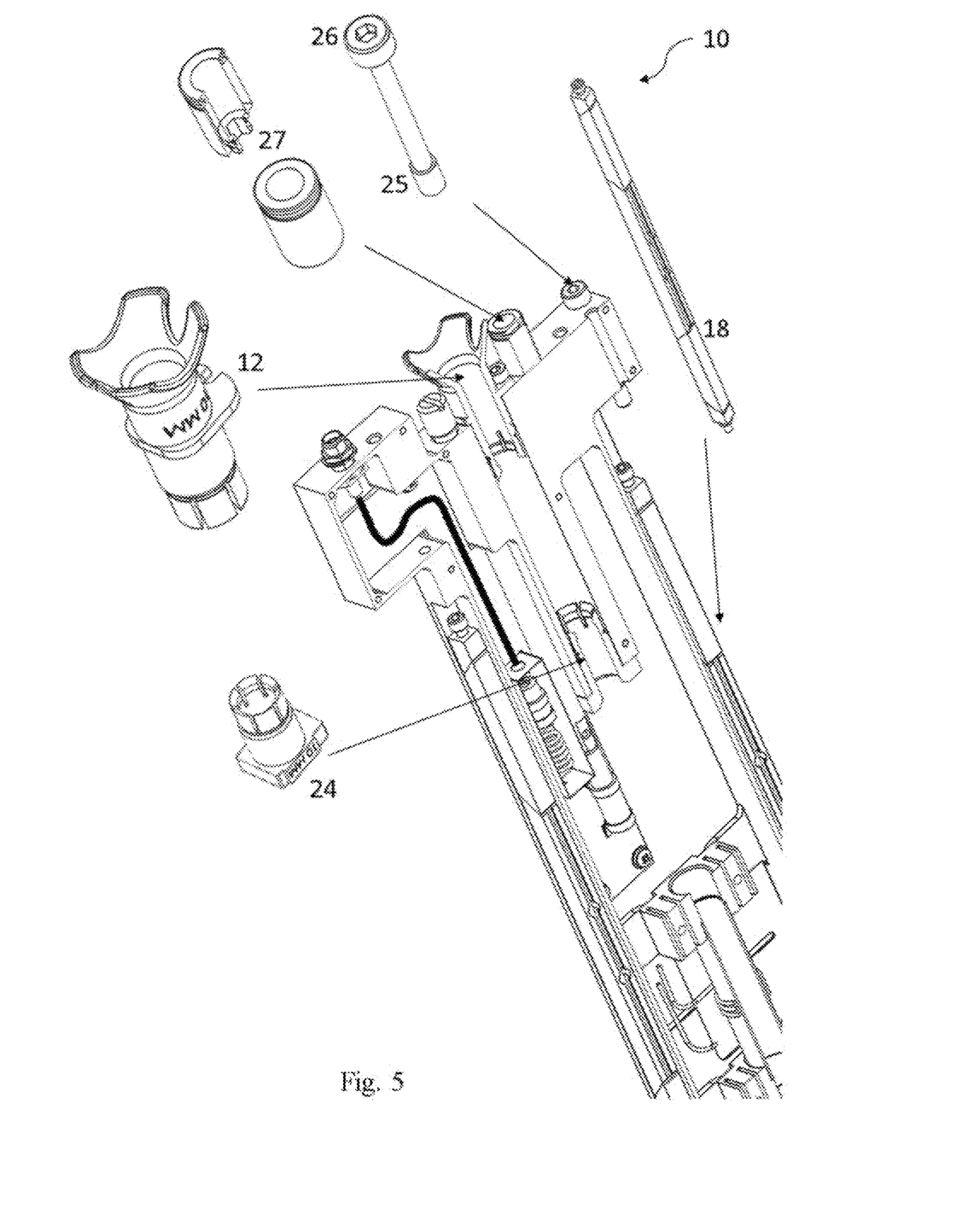
FIG. 5 provides a part illustration part exploded of one embodiment of an NMR probe cassette and some parts responsible for the right position of the same.

Reference is now made to FIG. 5 schematically presenting a part illustration, part exploded view of the NMR probe cassette 10 and some specific parts that are responsible for the correct allocation of the cassette and the sample in the NMR machine.

Fine positioner system 18; locking screw 25; locking knob 26; temperature air system connection point 27; entry point of the sample 12; frontal tube fixer 24.

Figure 6:
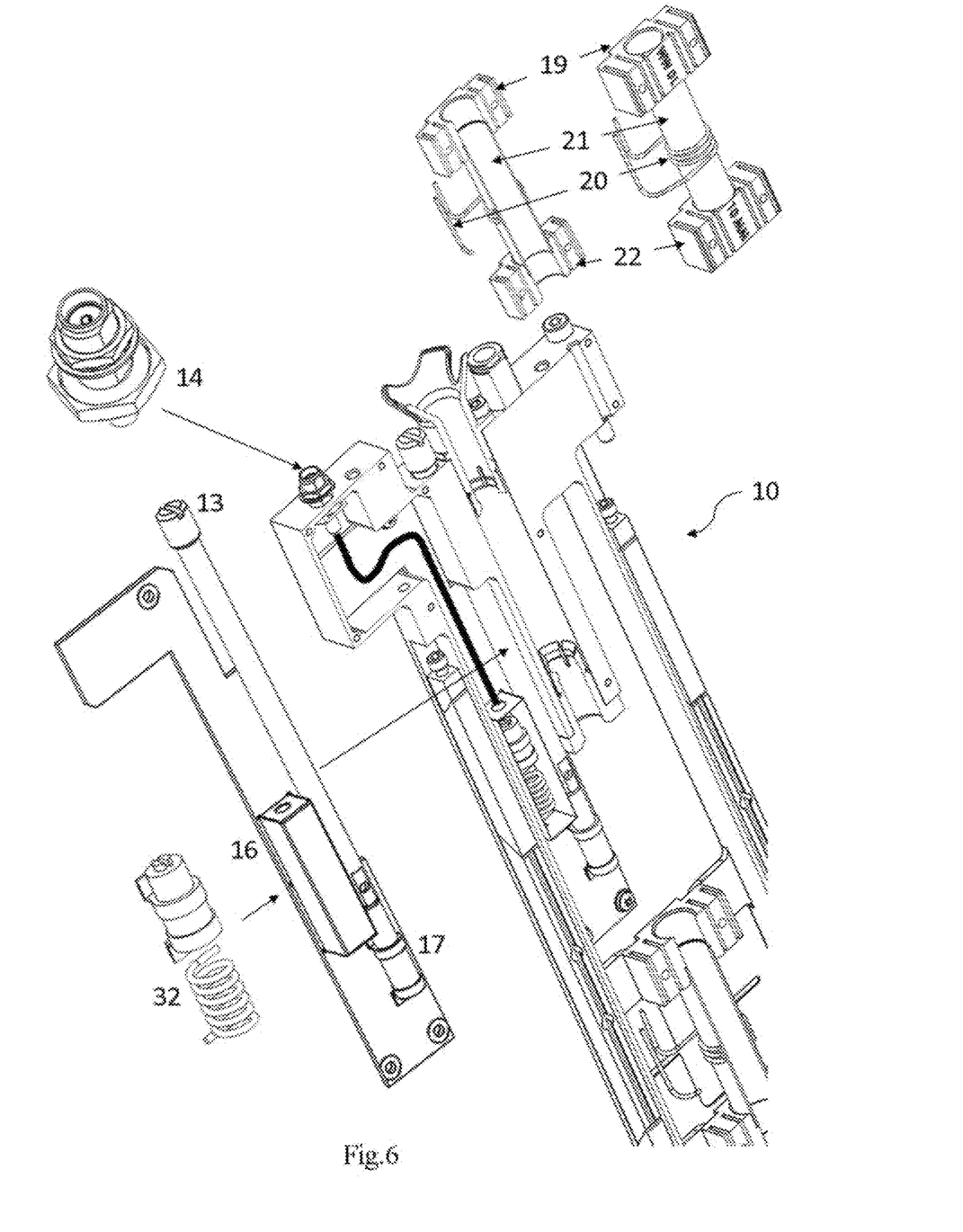
FIG. 6 provides a part illustration part exploded of one embodiment of an NMR probe cassette and some parts responsible for the electromagnetic actions of the same.

Reference is now made to FIG. 6 schematically presenting a part illustration, part exploded view of the NMR probe cassette 10 and some specific parts that are responsible for the correct allocation of the sample and the RF mechanism parts.

Frontal probe holder 19; RF coil 20; probe 21; distal probe holder 22; RF connection point 14; RF fine tuning knob 13; RF lock compartment 16; RF lock mechanism 32.

Figure 7:
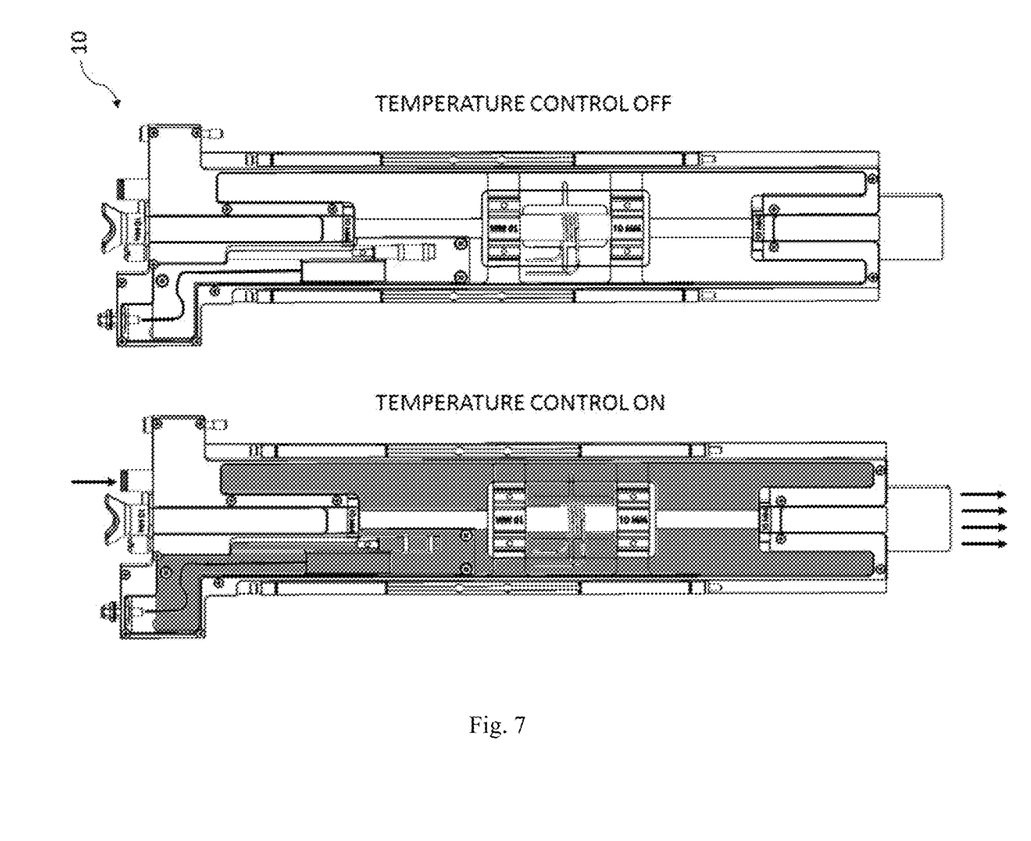
FIG. 7 provides an illustration of the temperature controlled zones of one embodiment of an NMR probe cassette.

Reference is now made to FIG. 7 schematically presenting an illustration of the NMR probe cassette 10 and the internal parts that are temperature controlled when operated (temperature control on—dark areas). The single arrow shows the point of entry of the air while the multiple arrows show the point of exit of the air.

The sample within conduit can maintain a temperature that is different enough (either higher or lower) than the operating temperature of the NMR device (and/or magnet), to adversely affect the NMR device. Utilizing a temperature controlling technology, such as air flow technology, can allow the conduit body to be maintained at substantially a constant temperature that corresponds to the operating temperature of magnet. Heat from conduit can be transferred out through the exit apertures 30 located at the rear part of the cassette.

In operation, a temperature-controlled probe such as presented here, the probe 21 can be subjected to a magnetic field provided by a magnet. For the FIG. 7 embodiment, Air flow controller (not shown) can be configured to maintain probe 21 at the desired temperature. The sample can then be introduced to or entered into the probe 21, and may either flow through the conduit or may remain in a non-flowing manner in the conduit, while NMR analysis is performed. The NMR analysis, including operation of the RF coil 20 and frequency lock RF coil 32, including pulse sequence protocols, can be in accordance with conventional NMR analysis. By using the temperature control mechanism as described, the temperature effects of the sample on the magnetic field can be minimized, if not eliminated, by allowing the temperature control sensor and device, or in this embodiment the heat pipes, to maintain the temperature of the probe conduit body at substantially the same temperature (e.g., desired operating temperature of magnet/NMR). As provided previously herein, the temperature control electronics (not shown) can be equipped to allow a user or other to input or otherwise designate the operating temperature.

Figure 8:
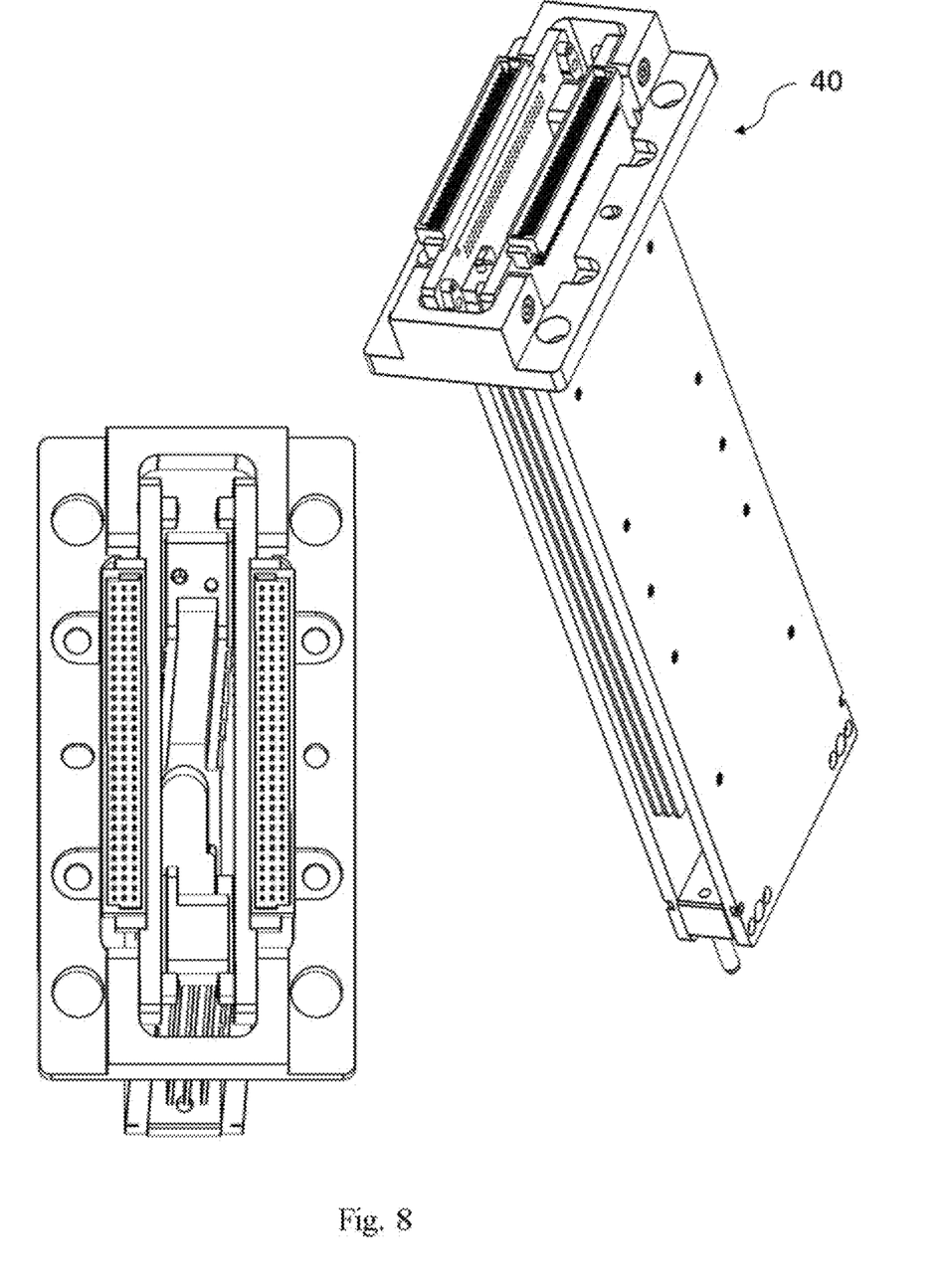
FIG. 8 provides a view of one embodiment of an NMR probe cassette housing.

Reference is now made to FIG. 8 schematically presenting the illustration of the NMR probe cassette's shimming housing 40. Longitudinal guides.

Figure 9:
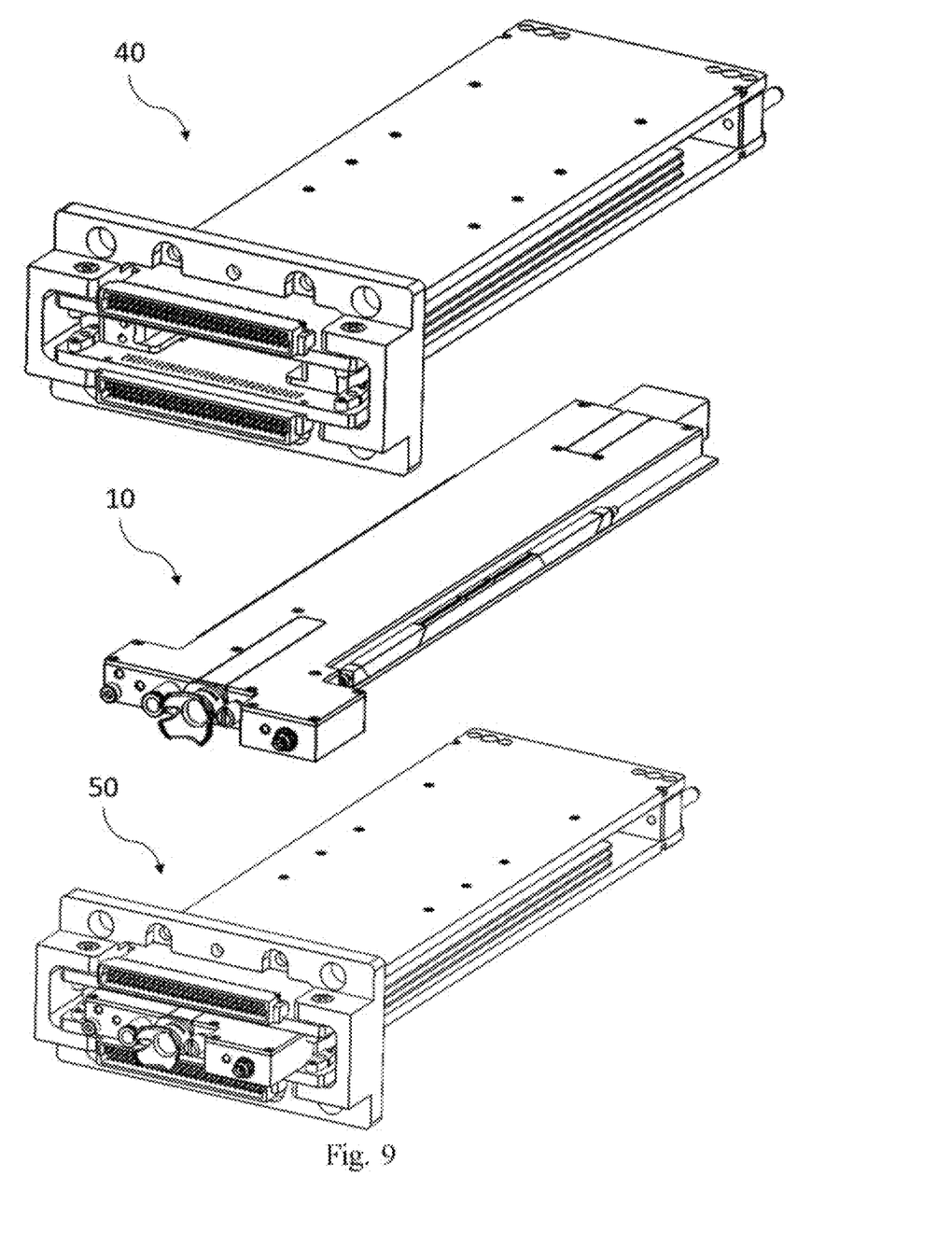
FIG. 9 provides a view of one embodiment of an NMR probe cassette, one embodiment of an NMR probe cassette housing and the view of both of them connected.

Reference is now made to FIG. 9 schematically presenting the illustration of the NMR probe cassette 10, the NMR probe cassette's shimming housing 40 and the combination of both 50.

While the method and systems have been disclosed in connection with the illustrated embodiments, various modifications and improvements thereon will become readily apparent to those skilled in the art. For example, the structure provided herein included a mostly rectangular body with a circular conduit, etc. Those with ordinary skill in the art will recognize that such shapes and sizes are merely for illustrative purposes, and can be varied accordingly based on application without departing from the scope of the disclosed methods and systems. Accordingly, the body can be cylindrical, spherical, square, or another shape, and is not limited to the rectangular shape provided in the illustrated embodiment. The conduit and openings for the conduit can similarly be another shape besides the circular (cross-section) shape provided herein, and can be rectangular, triangular, square, etc., for example. For embodiments that utilize heat pipes, for example, the heat pipes can be located at other locations or can be replaced entirely with another sensor/controller or set of sensors/controllers. The heat pipes or other sensor and/or heat exchanger are not required to be placed in cylindrical or other particularly shaped grooves or openings, and such grooves or openings, if used, are not required to coincide with the entire length of the conduit body as provided in the illustrated embodiment. Furthermore, in an embodiment where grooves or openings are used, such grooves or openings can be another shape than the shape provided herein. The connection between the processor and the sensor/controller can be wired or wireless or can be through a wired or wireless network. The aforementioned changes are also merely illustrative and not exhaustive, and other changes can be implemented without affecting the ability of the probe to include a conduit body that is temperature controlled. Accordingly, many additional changes in the details, materials, and arrangement of parts, herein described and illustrated, can be made by those skilled in the art. It will thus be understood that the following claims are not to be limited to the embodiments disclosed herein, can include practices otherwise than specifically described, and are to be interpreted as broadly as allowed under the law.

What is claimed is:

1. A nuclear magnetic resonance (NMR) probe cassette, comprising
    a conduit body made of a non-magnetic material, having a longitudinal axis with an entry point opening at one end to receive a sample to be analyzed, the sample having a temperature, the entry point opening centered on said axis;
    an air system connector to flow air into the NMR probe cassette to substantially maintain said conduit body at a predetermined temperature when the sample having the temperature is positioned within the NRM probe cassette and exposed to magnetic field while an NMR measurement is obtained; and
    a plurality of temperature air exit apertures for allowing air flowing through the conduit body to exit the NMR probe cassette.

2. The NMR probe cassette according to claim 1, wherein the air system connector is coupled to a heated air blower.

3. The NMR probe cassette according to claim 1, wherein said cassette further comprises a temperature sensor.

4. A NMR probe cassette according to claim 3, wherein said temperature sensor is configured to communicate with a processor that can control a temperature of the air flowing into the NMR probe.

* * * * *